(12) United States Patent
Shioya (10) Patent No.: US 7,990,049 B2
(45) Date of Patent: Aug. 2, 2011

(54) ORGANIC ELECTROLUMINESCENT DEVICE AND PRODUCTION METHOD OF THE DEVICE, AND DISPLAY APPARATUS

(75) Inventor: Shunsuke Shioya, Abiko (JP)

(73) Assignee: Canon Kabushiki Kaisha, Tokyo (JP)

( * ) Notice: Subject to any disclaimer, the term of this patent is extended or adjusted under 35 U.S.C. 154(b) by 247 days.

(21) Appl. No.: 12/203,603

(22) Filed: Sep. 3, 2008

(65) Prior Publication Data
US 2009/0072723 A1    Mar. 19, 2009

(30) Foreign Application Priority Data
Sep. 3, 2007   (JP) ................................ 2007-227725

(51) Int. Cl.
*H01L 51/54* (2006.01)
(52) U.S. Cl. ....................................... 313/504; 428/690
(58) Field of Classification Search .......... 313/503–512; 428/690
See application file for complete search history.

(56) References Cited

U.S. PATENT DOCUMENTS

| 2002/0121860 | A1 | 9/2002 | Seo et al. ...................... 313/506 |
| 2005/0093432 | A1* | 5/2005 | Yamazaki et al. ............ 313/503 |
| 2005/0170208 | A1* | 8/2005 | Yatsunami et al. ........... 428/690 |
| 2007/0065180 | A1* | 3/2007 | Yatsunami .................... 399/220 |
| 2008/0054799 | A1* | 3/2008 | Satou ............................ 313/504 |

FOREIGN PATENT DOCUMENTS

| JP | 01-312873 | 12/1989 |
| JP | 09-063771 | 3/1997 |
| JP | 2002-324680 | 11/2002 |
| JP | 2006-114759 | 4/2006 |

* cited by examiner

*Primary Examiner* — Nimeshkumar D Patel
*Assistant Examiner* — Mary Ellen Bowman
(74) *Attorney, Agent, or Firm* — Fitzpatrick, Cella, Harper & Scinto (57) ABSTRACT

Provided are an organic electroluminescent device having high efficiency and a long lifetime, and a production method of the device. The organic electroluminescent device includes an anode, a cathode, and a stacked body interposed between the anode and the cathode and formed by sequentially stacking at least an inorganic compound layer and an organic emission layer, in which the inorganic compound layer has a hole-transporting ability and a work function of the inorganic compound layer changes continuously in a film thickness direction of the inorganic compound layer.

6 Claims, 4 Drawing Sheets

⬣ : HOLE
◯ : ELECTRON

ORGANIC ELECTROLUMINESCENT DEVICE AND PRODUCTION METHOD OF THE DEVICE, AND DISPLAY APPARATUS

BACKGROUND OF THE INVENTION

1. Field of the Invention

The present invention relates to an organic electroluminescent device and a production method of the device, and a display apparatus.

2. Description of the Related Art

An electroluminescent device (EL device) has been attracting attention because the device is of a self-emission type, has high visibility, is excellent in display performance, can respond at a high speed, and can achieve a thickness reduction, so that the device has a potential to serve as a display device such as a flat panel display.

Of the electroluminescent device, an organic electroluminescent device using an organic compound as a light-emitting body has, for example, the characteristics that the device can be driven at a lower voltage than the voltage at which an inorganic electroluminescent device is driven, the area of the device can be easily enlarged, and the device can easily provide a desired emission color by selecting an appropriate light-emitting material. Accordingly, the organic electroluminescent device has been actively developed as a next-generation display.

Meanwhile, an organic electroluminescent device is produced by employing a dry process in which layer formation is performed by a vacuum evaporation method or the like; or the so-called coating film formation process in which layer formation is performed by a spin coating method, a casting method, an ink-jet method, or the like. Alternatively, the device is sometimes produced by a combination of the dry process and the coating film formation process.

Here, an organic electroluminescent device produced by the above coating film formation method (hereinafter, referred to as "coating organic electroluminescent device") has, for example, the following merits: (1) the device can be produced at a low cost as compared to an organic electroluminescent device produced by the dry process; (2) the device can be increased in area easily as compared to the organic electroluminescent device produced by the dry process; and (3) the controllability of doping in a slight quantity is excellent as compared to the organic electroluminescent device produced by the dry process.

Figure 7:
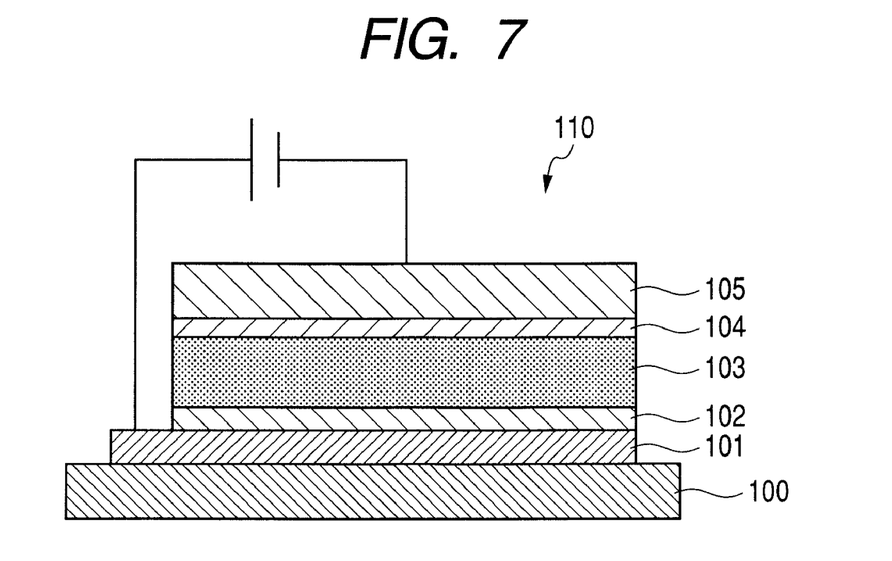
FIG. 7 is a view illustrating a general constitution of a coating organic electroluminescent device.

FIG. 7 is a view illustrating a general constitution of a coating organic electroluminescent device. An organic electroluminescent device 110 illustrated in FIG. 7 includes sequentially an anode 101, a hole injection layer 102, a light-emitting layer (hereinafter simply referred to as "emission layer") 103, an electron injection layer 104, and a cathode 105 sequentially provided on a substrate 100.

In the organic electroluminescent device 110 shown in FIG. 7, a mixture of polythiophene and polystyrene sulfonic acid (PEDOT:PSS) as represented by the following formula is generally used in the hole injection layer 102, and the layer is formed by a method such as spin coating.

Here, PEDOT:PSS is soluble in water and insoluble in a non-polar solvent. Accordingly, even when the emission layer 103 is formed by a coating process involving dropping a solution prepared by dissolving a constituent material of the emission layer 103 in a non-polar solvent onto the hole injection layer 102 (PEDOS:PSS film), the PEDOT:PSS film will not be eluted. Therefore, PEDOT:PSS is regarded as a suitable hole injection material in production of a coating organic electroluminescent device.

When the emission layer 103 is formed by the coating film formation process, polyphenylene vinylene, polyfluorene, or polyvinyl carbazole, or a derivative thereof is used and formed into a film on the above PEDOT:PSS film by a spin coating method or the like. Subsequently, the electron injection layer 104 formed of, for example, lithium fluoride and a metal electrode as the cathode 105 are sequentially formed on the emission layer 103 by a vacuum evaporation method, whereby the organic electroluminescent device 110 is completed.

As described above, the coating organic electroluminescent device has such excellent characteristic that the device can be produced by a simple process and is therefore expected to find use in a variety of applications. However, the coating organic electroluminescent device involves the two problems to be solved that the device cannot provide sufficiently large emission intensity and does not have a sufficient lifetime.

Although various hypotheses have been made on the reason why the device cannot obtain sufficiently large emission intensity, one possible main reason for the foregoing is the degradation of PEDOT:PSS as a constituent material for the hole injection layer 102. This is considered to be attributable to that during energization of the device, sulfur atoms and hydrogen atoms derived from the sulfo groups, and an ionic component such as sodium ions contained as an impurity diffuse into the emission layer 103 to cause an undesirable action in the emission layer 103.

In view of the above-mentioned problems, an inorganic oxide disclosed in Japanese Patent Application Laid-Open No. 2006-114759 has been proposed as a constituent material for a hole injection layer serving as an alternative to PEDOT:PSS. In Japanese Patent Application Laid-Open No. 2006-114759, a device is produced by forming a film of a metal oxide of vanadium, molybdenum, or the like on an ITO electrode, and the sequentially stacking a buffer layer (electron-blocking layer), an emission layer, and an electrode (cathode) thereon. Japanese Patent Application Laid-Open No. 2006-114759 also shows that a device using an inorganic oxide as a constituent material for a hole injection layer is superior in emission efficiency and lifetime to a device using PEDOT: PSS as a constituent material for a hole injection layer.

Similar reports have been made also on an evaporation organic electroluminescent device. For example, Japanese Patent Application Laid-Open No. H01-312873 shows that the use of an inorganic compound as a constituent material for a hole injection layer (hole-transporting layer) can reduce the drive voltage and can improve the durability of the device; and Japanese Patent Application Laid-Open No. H09-063771 shows that the use of an organic compound as a constituent material for a hole injection layer (hole-transporting layer) can reduce the drive voltage and can improve the durability of the device.

In addition, when an energy barrier at an interface between adjacent layers in an organic electroluminescent device is large, the lifetime of the device may be shortened by an increase in the drive voltage or accumulation of charge at the interface portion. Accordingly, in the organic electroluminescent device, the energy barrier at an interface is preferably made as small as possible. Here, in order to solve the energy barrier problem, Japanese Patent Application Laid-Open No. 2002-324680 makes the proposal that a layer obtained by mixing organic compounds constituting two adjacent organic layers is inserted into an interface portion between the two organic layers. Attempts have been made to reduce an energy barrier at an interface between two organic layers on the basis of the proposal.

The use of an inorganic compound as a constituent material for a hole injection layer in the organic electroluminescent device disclosed in each of Japanese Patent Application Laid-Open Nos. 2006-114759, H01-312873, and H09-063771 has surely improved the characteristics of the device. However, the use is insufficient for further improvement in the characteristics of the device because the use simultaneously involves the problems of generation of an interface barrier between the hole injection layer and another layer and an increase in resistance of the hole injection layer itself.

In addition, in Japanese Patent Application Laid-Open No. 2002-324680, the formation of the mixed layer can surely reduce the interface barrier. However, because the technology involves joining of organic compounds soluble in a non-polar solvent, it is difficult to apply the technology disclosed in the document to a coating organic electroluminescent device.

SUMMARY OF THE INVENTION

The present invention has been accomplished in view of the above problems, and it is, therefore, an object of the present invention to provide an organic electroluminescent device having high efficiency and a long lifetime, and a production method of the device.

The organic electroluminescent device of the present invention includes an anode, a cathode, and a stacked body interposed between the anode and the cathode and formed by sequentially stacking at least an inorganic compound layer and an organic emission layer, in which the inorganic compound layer has a hole-transporting ability, and a work function of the inorganic compound layer changes continuously in a film thickness direction of the inorganic compound layer.

According to the present invention, there can be provided an organic electroluminescent device having high efficiency and a long lifetime, and a production method of the device.

Further features of the present invention will become apparent from the following description of exemplary embodiments with reference to the attached drawings.

DESCRIPTION OF THE EMBODIMENTS

First, an organic electroluminescent device of the present invention will be described. The organic electroluminescent device of the present invention is constituted of at least an anode, a cathode, and a stacked body interposed between the anode and the cathode and formed by sequentially stacking at least an inorganic compound layer and an organic emission layer.

Hereinafter, embodiments of the present invention will be described in detail with reference to the accompanying drawings. However, the present invention is not limited thereto.

Hereinafter, reference numerals will be described below.

In the figures, reference numeral 1 denotes a substrate; 2 denotes an anode; 3 an inorganic compound layer; 4 an organic emission layer; 5 an electron injection layer; 6 a cathode; 7 a high dielectric composition layer; 8 a low dielectric composition layer; 9 a low dielectric composition layer; 10, 20, 110 each denote an organic electroluminescent device; 11 an electron-blocking layer; 100 a substrate; 101 an anode; 102 a hole injection layer; 103 an emission layer (light-emitting layer); 104 an electron injection layer; and 105 denotes a cathode.

Figure 1:
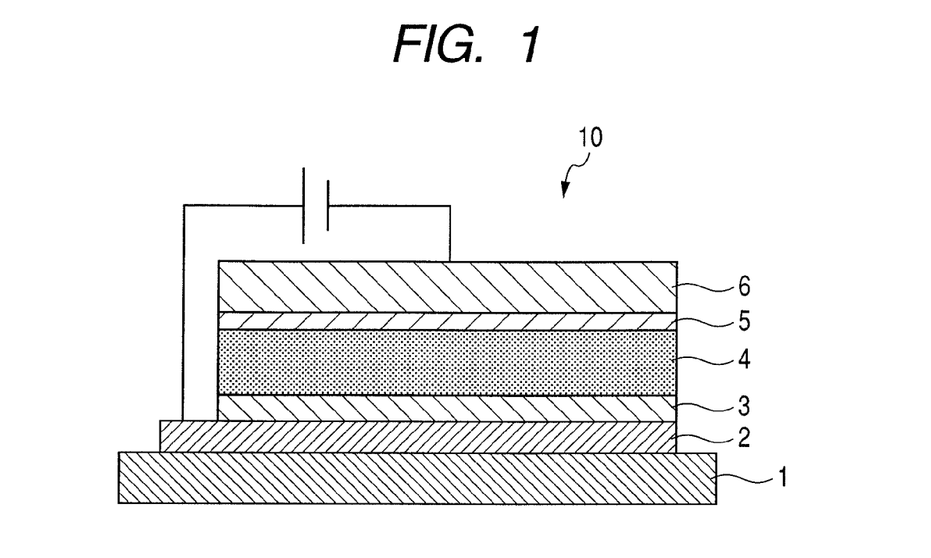
FIG. 1 is a cross-sectional view illustrating an organic electroluminescent device according to a first embodiment of the present invention.

FIG. 1 is a cross-sectional view illustrating an organic electroluminescent device according to a first embodiment of the present invention. The organic electroluminescent device 10 illustrated in FIG. 1 has the anode 2, the inorganic compound layer 3, the organic emission layer 4, the electron injection layer 5, and the cathode 6 sequentially stacked in the mentioned order on the substrate 1.

However, it is to be noted that the embodiment of the organic electroluminescent device of the present invention is not limited to the foregoing. For example, in the embodiment shown in FIG. 1, at least one of an electron-transporting layer and a hole-transporting layer may additionally be provided as intervening layer(s). Alternatively, an electron-blocking layer to be described later may be further provided in the embodiment shown in FIG. 1.

Alternatively, a hole injection layer may be formed by combining the inorganic compound layer 3 and any other organic compound layer, or the electron injection layer may be omitted.

In the organic electroluminescent device of the present invention, the inorganic compound layer 3 has a hole-transporting ability, and the work function of the inorganic compound layer 3 changes continuously in the film thickness direction thereof.

The term "changes continuously" as herein employed refers to a state where the work function of the inorganic compound layer 3 changes in the form of a continuous function in the film thickness direction. In addition, the change in the form of a continuous function includes, for example, a change in a linear, parabolic, or exponential curve.

In particular, continuously changing the work function of the inorganic compound layer 3 in the film thickness direction can reduce the drive voltage of the organic electroluminescent device of the present invention, improve the emission efficiency of the device; and lengthen the lifetime of the device as compared to those in the case where the work function in the inorganic compound layer 3 does not change. In addition, continuously changing the work function of the inorganic compound layer 3 in the film thickness direction thereof can reduce an interface barrier between layers as compared to that in the case where the inorganic compound layer 3 is of a multilayer structure and the work function is changed for each layer of the structure. Therefore, the organic electroluminescent device of the present invention can be driven at a reduced voltage, and can show improved emission efficiency and an improved lifetime.

Figure 2:
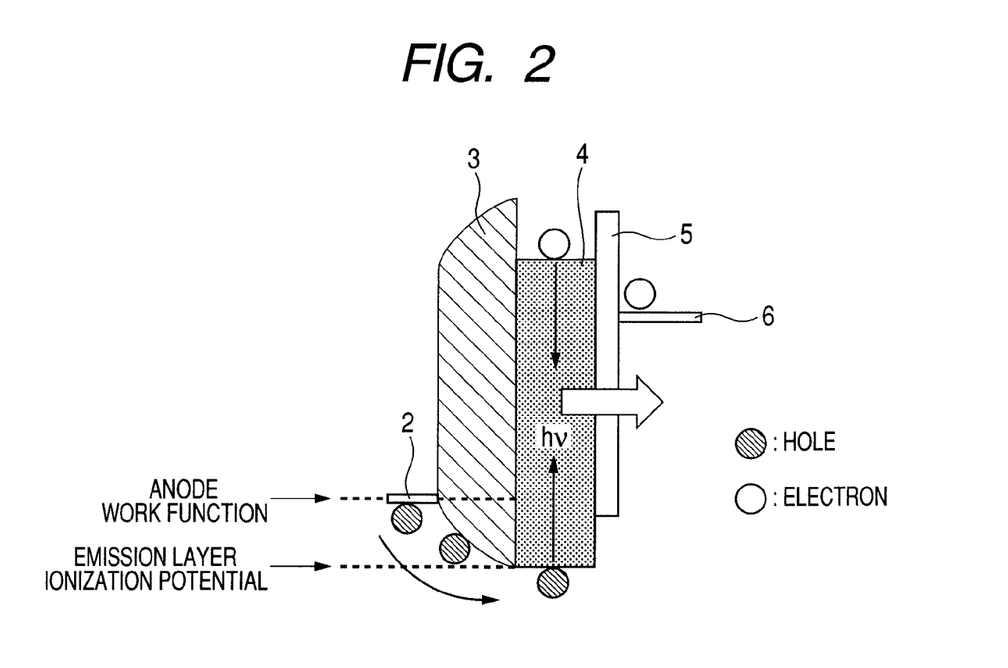
FIG. 2 is a diagram illustrating the energy levels of respective layers which constitute the organic electroluminescent device of FIG. 1.

FIG. 2 is a diagram illustrating the energy levels of the respective layers which constitute the organic electroluminescent device of FIG. 1. FIG. 2 shows the case where the work function of the inorganic compound layer 3 is reduced continuously (reduced in a continuous function manner) from the anode 2 to the organic emission layer 4. When the ionization potential of the emission layer is deeper than the work function of the anode as illustrated in FIG. 2, it is preferable that the work function of the inorganic compound layer 3 be reduced continuously from the anode 2 side to the organic emission layer 4 side. As a result, an energy difference between the anode 2 and the anode side of the inorganic compound layer 3, and an energy difference between the organic emission layer 4 and the organic emission layer side of the inorganic compound layer 3 each become small. As described above, it is preferable that the work function of the inorganic compound layer 3 be changed continuously so that a difference in work function between the inorganic compound layer 3 and each of its adjacent layers becomes small. Thereby, the property of injecting holes into the organic emission layer 4 is improved.

Examples of the inorganic compound to be used as a constituent material of the inorganic compound layer 3 include, but not limited to, molybdenum oxide, vanadium oxide, silver oxide, copper oxide, nickel oxide, chromium oxide, tungsten oxide, niobium oxide, tantalum oxide, titanium oxide, zirconium oxide, hafnium oxide, scandium oxide, yttrium oxide, tantalum oxide, manganese oxide, iron oxide, ruthenium oxide, osmium oxide, cobalt oxide, zinc oxide, cadmium oxide, aluminum oxide, gallium oxide, indium oxide, silicon oxide, germanium oxide, tin oxide, lead oxide, antimony oxide, and bismuth oxide; various metal oxides such as rare-earth oxide; and composite metal oxides such as $CuAlO_2$ and $SrCu_2O_2$. Further, halides such as CuI, AgI, and PbBr, sulfides such as CuS and ZnS, Group II-VI and III-V compounds such as GaAs, CdTe, CdSe, ZnTe, GaN, and AlN, and compounds of Group IV elements such as Si and Ge, and carbides such as SiC can also be used.

Of the above-mentioned inorganic compounds, a metal oxide is preferable. The metal oxide has high stability, and its work function can be changed in correspondence with a step-by-step change of the metal species of the metal oxide. In addition, by changing the compositional ratio of a metal element and oxygen, the work function of the compound can be changed in a wide variety of ways. In addition, such metal compounds show hole injection property. Further, such a metal compound has high stability and can therefore improve the stability of the device. Accordingly, the use of a metal oxide as a constituent material for the inorganic compound layer 3 can provide an organic electroluminescent device having high efficiency and a long lifetime.

A preferable method of continuously changing the work function of the inorganic compound layer 3 is to continuously change the composition of the constituent material for the inorganic compound layer 3. Here, the inorganic compound contains large amounts of nonstoichiometric materials, and the work function of the layer will also change in association with a change in the composition of the compound. Accordingly, in the organic electroluminescent device of the present invention, the work function of the inorganic compound layer 3 can be changed continuously by changing the composition of the layer. A continuous change of the composition is achieved by continuously changing the environment at the time of the film formation. Accordingly, in the organic electroluminescent device of the present invention, the work function of the inorganic compound layer 3 can be changed continuously with ease.

When, for example, an oxide is used as a constituent material for the layer, the work function of the layer can be changed continuously by gradually increasing or decreasing the oxygen content of the oxide. In addition, in the case of the materials other than the oxide, the work function of the layer formed of, for example, a chalcogen compound such as a sulfide, a halogen compound such as an iodide, a nitride, or a carbide can be changed continuously by increasing or decreasing the content of the corresponding element (sulfur atom, halogen atom, nitrogen atom, or carbon atom). That is, as is the case with the oxide, the work function of the layer can be changed by changing the content of an element that pairs with a metal element.

In addition, in the present invention, in addition to the foregoing, the work function of the layer can be changed continuously by continuously changing the composition of the layer into that of another compound, for example, by changing an oxide into a nitride or a halogen compound. In addition, even when a composite compound such as represented by $A_xB_yC_z$ (where A and B each represent a metal element) is used as a constituent material for the layer, the work function of the layer can be changed to a desired one by changing a value of each of x, y, and z.

However, when the work function of the inorganic compound layer is changed continuously by continuously changing the compositional ratio of the inorganic compound layer, a continuous composition distribution may disappear due to the diffusion of a part of constituent elements for the layer caused by a temperature rise at the time of a heat treatment step after the layer formation or the driving of the device. In order to resolve this problem, it is sufficient that a layer having high covalency, which is formed of, for example, a nitride or carbide, is provided at a desired place, whereby the diffusion of the above constituent elements can be prevented.

On the other hand, in the organic electroluminescent device, the ionization potential of the organic emission layer is generally about 5.0 to 6.5 eV, so that the energy level of the layer is often deeper than the work function (about 5.0 eV) of, for example, ITO which is generally used as the anode. Accordingly, in the organic electroluminescent device of the present invention, it is preferable that the inorganic compound layer satisfies the requirements described below. That is, as illustrated in FIG. 2, the work function of the inorganic compound layer 3 on the anode 2 side is shallower than an intermediate level between the work function and the ionization potential of the two layers sandwiching the inorganic compound layer 3. In addition, the work function of the inorganic compound layer 3 on the organic emission layer 4 side is deeper than the intermediate level between the work function and the ionization potential of the two layers sandwiching the inorganic compound layer 3. Incidentally, the term "intermediate level" as employed herein refers to an energy level which is located just at an intermediate point between the work function of the anode 2 and the ionization potential of the organic emission layer 4.

As described above, the ionization potential of the organic emission layer is at an energy level deeper than the work function of the anode. Accordingly, it is preferable that the level of the work function or ionization potential of a layer provided between the anode 2 and the organic emission layer 4 is gradually deepened from the anode side to the organic emission layer side irrespective of whether the number of layers is singular or plural. In the organic electroluminescent device of the present invention, by appropriately setting the work functions of interfaces of the inorganic compound layer 3 with adjacent layers, holes can be injected from the anode into the organic emission layer more efficiently.

In addition, the work function on the anode side of the inorganic compound layer is made close to the level of the anode or of a layer adjacent to the inorganic compound layer on the anode side, and the work function on the organic emission layer side of the inorganic compound layer is made close to the level of the emission layer or of a layer adjacent to the inorganic compound layer on the emission layer side. As a result, the energy barrier at each interface can be further reduced.

In addition, in the organic electroluminescent device of the present invention, when the inorganic compound layer 3 is in direct contact with the anode 2 as illustrated in FIG. 1, the composition of the layer on the side being in contact with the anode 2 may be, for example, one having high conductivity such as a metal. As a result, the junction between the anode 2 and the inorganic compound layer 3 can be an ohmic junction, whereby the hole injection property can be improved.

In addition, in the organic electroluminescent device of the present invention, even when the composition of a material which constitutes the inorganic compound layer has a desired work function but has low conductivity, by providing another composition having high conductivity in the layer, an adjustment can be made so that the resistance of the entire layer is reduced. As a result, the organic electroluminescent device of the present invention can be driven at a reduced voltage. In particular, when the composition has a desired work function but has remarkably low conductivity, for example, the thickness of a low dielectric layer (low conductive composition layer) is reduced while the thickness of a high dielectric layer (high conductive composition layer) is increased.

Figure 3:
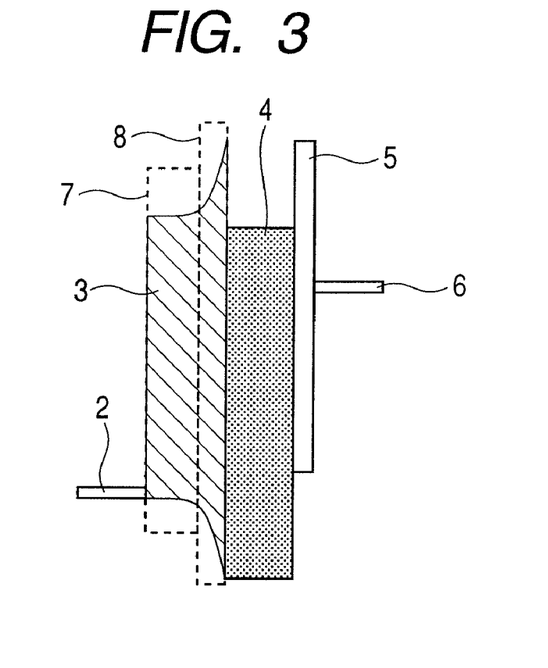
FIG. 3 is a diagram illustrating, in terms of energy level, a first example in which a low dielectric composition layer and a high dielectric composition layer are provided, in terms of an energy level.
Figure 4:
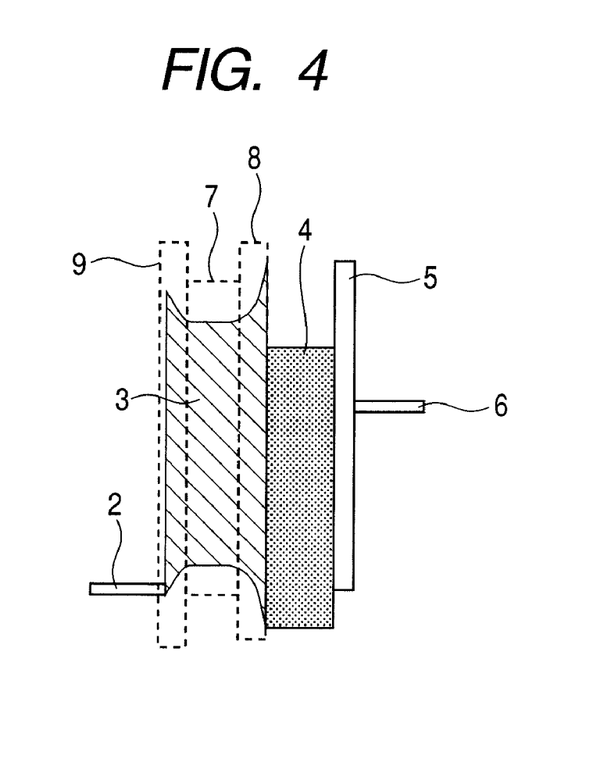
FIG. 4 is a diagram illustrating, in terms of energy level, a second example in which a low dielectric composition layer and a high dielectric composition layer are provided.

An example in which a low dielectric composition layer and a high dielectric composition layer are provided will be described below with reference to the figures. FIG. 3 is a diagram illustrating, in terms of energy level, a first example in which a low dielectric composition layer and a high dielectric composition layer are provided, in terms of an energy level. In the first example, the high dielectric composition layer 7 is on the anode 2 side, and the low dielectric composition layer 8 is on the organic emission layer 4 side. In the first example, in order to improve the conductivity, it suffices to reduce the film thickness of the low dielectric composition layer 8. FIG. 4 is a diagram illustrating, in terms of energy level, a second example in which a low dielectric composition layer and a high dielectric composition layer are provided, in terms of an energy level. In the second example, the low dielectric composition layer 8 is on the organic emission layer 4 side, and the low dielectric composition layer 9 is on the anode 2 side. In the second example, in order to improve the conductivity, it suffices to provide the high dielectric composition layer 7 between the low dielectric composition layers 8 and 9 and to reduce the film thickness of each of the low dielectric composition layers 8 and 9. As a result, the resistance of the organic electroluminescent device can be reduced.

In addition, the organic electroluminescent device of the present invention is of such a composition (wide band gap) that the energy gap of the inorganic compound layer 3 increases continuously from the anode 2 side to the organic emission layer 4 side as illustrated in FIG. 2. With such a composition, an electron-blocking ability can be developed in which electrons are prevented from moving from the organic emission layer 4 to the inorganic compound layer 3, with the result that electrons and holes can be recombined with each other more efficiently.

Figure 5:
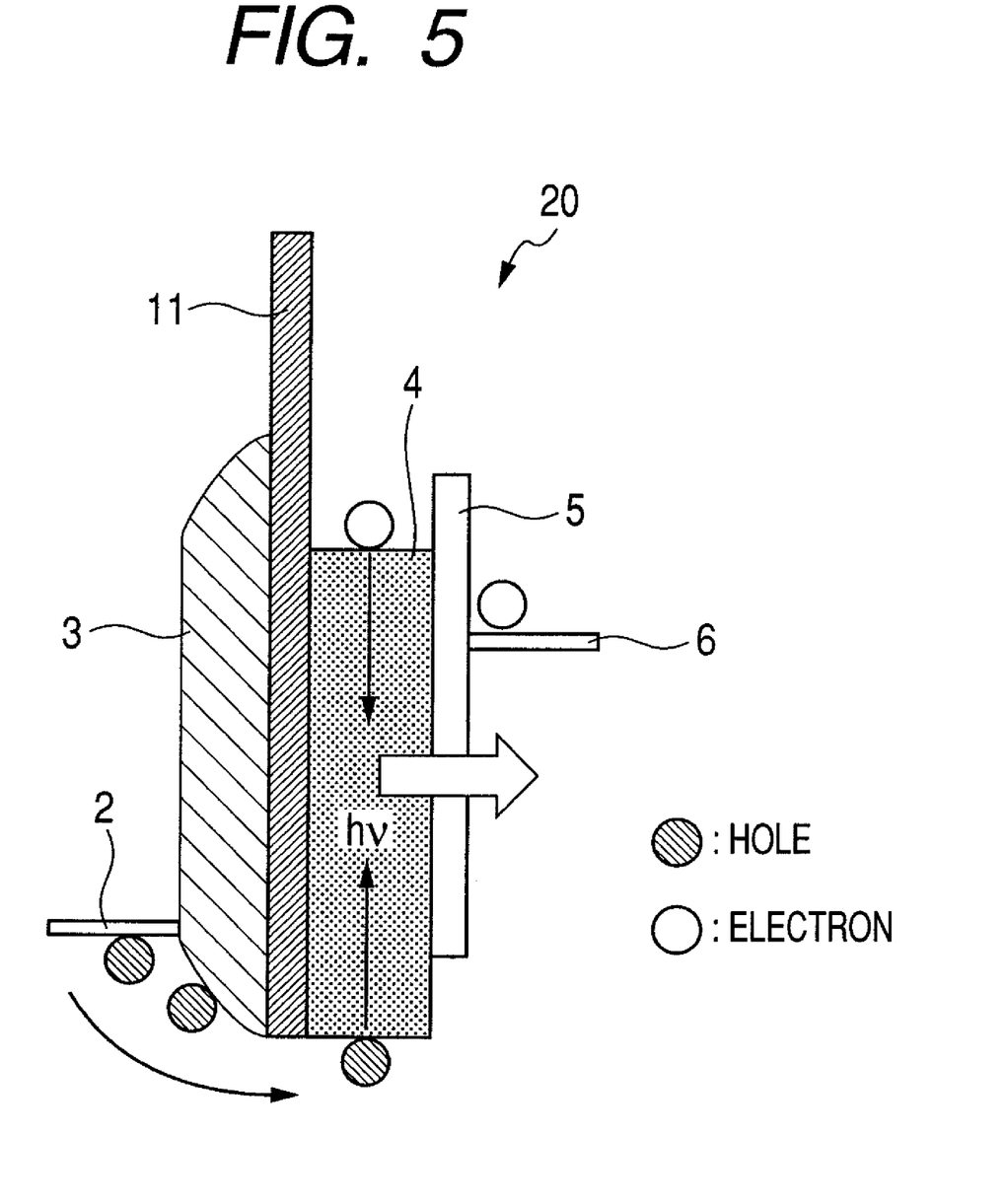
FIG. 5 is a diagram illustrating, in terms of energy level, an organic electroluminescent device according to a second embodiment of the present invention.

FIG. 5 is a diagram illustrating, in terms of energy level, an organic electroluminescent device according to a second embodiment of the present invention. The organic electroluminescent device 20 shown in FIG. 5 is provided with the electron-blocking layer 11 between the inorganic compound layer 3 and the organic emission layer 4. The inorganic compound layer 3 may have a trap level resulting from a crystal grain boundary or crystal defect. Accordingly, even when the band gap of the inorganic compound layer 3 is made larger than that of the organic emission layer 4, electrons will be trapped in the inorganic compound layer 3 owing to the presence of the trap level. As a result, there are cases where electrons pass through the organic emission layer 4. In order to solve this problem, it is preferred that the electron-blocking layer 11 is provided between the inorganic compound layer 3 and the organic emission layer 4 as illustrated in FIG. 5. As a result, electrons can be prevented from passing through the organic emission layer 4 toward the inorganic compound layer 3.

When the inorganic compound layer 3 is formed of a polycrystalline material, a current may leak from the organic emission layer 4 owing to a trap level resulting from a crystal grain boundary or crystal defect. In the organic electroluminescent device of the present invention, providing the electron-blocking layer 11 between the inorganic compound layer 3 and the organic emission layer 4 can reduce the leakage of electrons toward the inorganic compound layer 3. As a result, an organic electroluminescent device having higher efficiency and a longer lifetime can be provided.

Incidentally, it is preferred that the electron-blocking layer 11 has smaller electron affinity than that of the organic emission layer 4 and is a p-type compound. Examples of the compound include, but not limited to, phthalocyanine derivatives, naphthalocyanine derivatives, and porphyrin derivatives; oxazole, oxadiazole, triazole, imidazole, imidazolone, pyrazoline, tetrahydroimidazole, polyarylalkane, butadiene, benzidine-type triphenylamine, styrylamine-type triphenylamine, diamine-type triphenylamine, and derivatives thereof; and a polymer material such as polyvinylcarbazole, polysilane, and conductive polymers. As a material having insulating property, in addition to the above compounds, SiN, $SiO_2$, siloxane compounds, and the like are exemplified.

Next, other materials which constitute the organic electroluminescent device of the present invention will be described.

The material used for the substrate 1 includes, for example, glass, ceramic, a compound, a metal, or a plastic, but is not particularly limited thereto. Here, when the structure of the device is of a bottom emission type, a transparent substrate such as a glass substrate is used. On the other hand, when the structure of the device is of a top emission type, a metal substrate is used, or a cathode material such as Ag is formed on a glass substrate or the like so as to form a mirror structure in order that light may be prevented from leaking to the lower portion of the substrate. In addition, the emission color can be controlled by additionally providing a color filter film, a fluorescent color conversion filter film, a dielectric reflection film, or the like to the substrate. Further, a thin film transistor may be produced on a substrate and the device may be produced so as to connect thereto.

The constituent material of the anode 2 preferably has as large a work function as possible. Examples of the material include elemental metals such as gold, platinum, silver, copper, nickel, palladium, cobalt, selenium, vanadium, tungsten or chromium, or alloys thereof; metal oxides such as tin oxide, zinc oxide, indium oxide, indium tin oxide, and indium zinc oxide, and halides such as CuI. Further, a conductive polymer such as polyaniline, polypyrrole, polythiophene, or polyphenylene sulfide may also be used. One kind of these electrode substances may be used alone, or two or more kinds of them may be used in combination. Further, the anode may be constituted of either a single layer or plural layers.

As the organic emission layer 4, any organic compound can be used as long as it emits light when applied with an electric field. Exemplified as a low-molecular weight compound are anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, a quinoline metal complex, an aminoquinoline metal complex, a benzoquinoline metal complex, pyrane, quinacridone, rubrene, and derivatives thereof; and a phosphorescent metal complex such as an iridium-phenylpyridine complex. In addition, as a polymer compound, polyvinylcarbazole, polyphenylene vinylene, polyfluorene, and derivatives thereof can be exemplified.

In addition, the organic emission layer 4 may be formed of a single organic compound, or may be a host-guest system. In the case of the host-guest system, the combination of a host and a guest may be any one of a combination of low-molecular weight compounds, a combination of a polymer compound and a low-molecular weight compound, and a combination of polymer compounds.

As the material for constituting the electron injection layer 5, any material can be used as long as the material has electron conductivity. Examples of the material include fluorides, carbonate compounds, and oxides of alkali metals or alkali earth metals such as LiF, $Cs_2CO_3$, and CaO. Further, other than the above materials, organic compounds having electron conductivity can also be preferably used. Examples of the organic compounds include quinoline derivatives such as an aluminum quinoline complex (Alq), oxadiazole derivatives, triazole derivatives, phenanthroline derivatives, perylene derivatives, pyridine derivatives, pyrimidine derivatives, quinoxaline derivatives, diphenylquinone derivatives, and nitro-substituted fluorene derivatives.

The material constituting the cathode 6 preferably has a low work function, and include, for instance an elemental metal such as lithium, sodium, potassium, calcium, magnesium, aluminum, indium, ruthenium, titanium, manganese, yttrium, silver, lead, tin, and chromium; or an alloy made of a plurality of the above metals, such as lithium-indium, sodium-potassium, magnesium-silver, aluminum-lithium, aluminum-magnesium, and magnesium-indium. A metal oxide such as indium tin oxide can be also used. These electrode materials can be used singly or in combination. In addition, the cathode may be either of a single layer configuration or of a multilayer configuration.

At least one of the anode 2 and the cathode 6 is desirably either transparent or translucent.

As the electron-transporting layer, any material may be used as long as the material transports electrons. For example, the electron-transporting materials as exemplified for the electron injection layer 5 can be used.

As the hole-transporting layer, any material may be used as long as the material transports holes. Examples of the material include, but not limited to: phthalocyanine derivatives, naphthalocyanine derivatives, and porphyrin derivatives; oxazole, oxadiazole, triazole, imidazole, imidazolone, pyrazoline, tetrahydroimidazole, polyarylalkane, butadiene, benzidine-type triphenylamine, styrylamine-type triphenylamine, diamine-type triphenylamine, and derivatives thereof; and polymer materials such as polyvinylcarbazole, polysilane, and conductive polymers.

Incidentally, in the organic electroluminescent device of the present invention, the produced device may be provided with a protective layer or an encapsulation layer, for the purpose of preventing contact with oxygen or moisture. Examples of such a protective layer include a diamond thin film; a film of an inorganic material such as a metal oxide and a metal nitride; a film of a polymer such as a fluororesin, polyparaxylene, polyethylene, silicone resin, and polystyrene resin; and further a film of a photocurable resin. Further, the produced device may also be covered with glass, a gas-impermeable film or a metal, or be packaged with a suitable encapsulation resin.

Next, a method of producing the organic electroluminescent device of the present invention will be described. The organic electroluminescent device of the present invention is characterized in that the organic emission layer is formed by a coating process. PEDOT:PSS represented by the following formula is generally used in the hole injection layer of an organic electroluminescent device produced by the coating process.

The reason why PEDOT:PSS is generally used in the hole injection layer is that PEDOT:PSS is water-soluble but is insoluble in a non-polar solvent that is used to dissolve an organic compound. Accordingly, stacking can be performed by forming a layer formed of an organic compound soluble in a non-polar solvent after the formation of the hole injection layer using PEDOT:PSS. However, as described above, PEDOT:PSS involves the problem that sulfur atoms and hydrogen atoms derived from sulfo groups, and, furthermore, an ionic component such as sodium as an impurity in PEDOT:PSS diffuse into the organic emission layer upon energization of the device, and that it is difficult to improve the lifetime of the device.

On the other hand, the inorganic compound itself which constitutes the inorganic compound layer of the organic electroluminescent device of the present invention has higher stability than that of PEDOT:PSS. Accordingly, the problem peculiar to PEDOT:PSS that a component generated by the degradation of PEDOT:PSS diffuses into the organic emission layer to affect the light-emitting characteristics of the device does not occur. In addition, the inorganic compound which constitutes the inorganic compound layer has resistance to an organic solvent as with PEDOT:PSS. Accordingly, even when a coating liquid to be used at the time of the formation of the organic emission layer is applied onto the inorganic compound layer, there is no fear of elution of the constituent material of the inorganic compound layer. Therefore, the organic electroluminescent device of the present invention can be provided as a coating organic electroluminescent device having a long lifetime.

Incidentally, the method of forming the inorganic compound layer includes, for example, an evaporation process or a sputtering process. In addition, as the method of continuously changing the work function in the layer, specifically, there is included a method of providing the layer with a composition gradient. Examples of the method of providing the composition gradient include a method of changing the partial pressure of a reaction gas by employing a reactive sputtering process, a method of changing an evaporation rate in multi-source evaporation, or a method of changing the kind of an organic metal or a gas pressure by employing metal organic vapor phase epitaxy (MOVPE). In addition to the foregoing, as the method of forming the inorganic compound layer, there can be included a sol-gel process or a coating process. Here, when the inorganic compound layer is formed of a metal oxide, a method can also be employed in which a metal film is formed and an oxide film is then formed by thermal oxidation thereof.

A display apparatus can be constructed by disposing a plurality of the organic electroluminescent devices of the present invention in the same plane to form pixels. Incidentally, the display apparatus of the present invention may be driven by either a passive matrix system or an active matrix system. The passive matrix system is a system in which electrodes are arranged in a lattice pattern including X and Y directions, and a voltage is applied to the electrodes so as to coincide in timing with each other to thereby turn on a pixel located at an intersection of the electrodes. On the other hand, the active matrix system is a system in which electrodes are arranged in a lattice pattern including X and Y directions, and a transistor serving as a switch is disposed at each intersection (pixel) of the electrodes such that each pixel is controlled and turned on independently of one another. Here, by using the organic electroluminescent device of the present invention, a display apparatus having high efficiency and a long lifetime can be provided.

EXAMPLES

Hereinafter, examples of the present invention will be described.

(Evaluation of Thin Film used as Inorganic Compound Layer)

$MoO_x$ to be used as a constituent member of the inorganic compound layer 3 in the below-mentioned examples was obtained by DC sputtering a Mo (4N) target in an atmosphere of mixed gas of argon and oxygen. Incidentally, the total pressure of the mixed gas at the time of the DC sputtering was about 0.3 Pa, and the electric power at that time was 400 W. An $MoO_x$ thin film was formed by the DC sputtering under the above-mentioned conditions while the oxygen partial pressure was changed. Then, the work function of the thus formed thin film was measured with a photoelectron spectroscope in the atmosphere.

Figure 6:
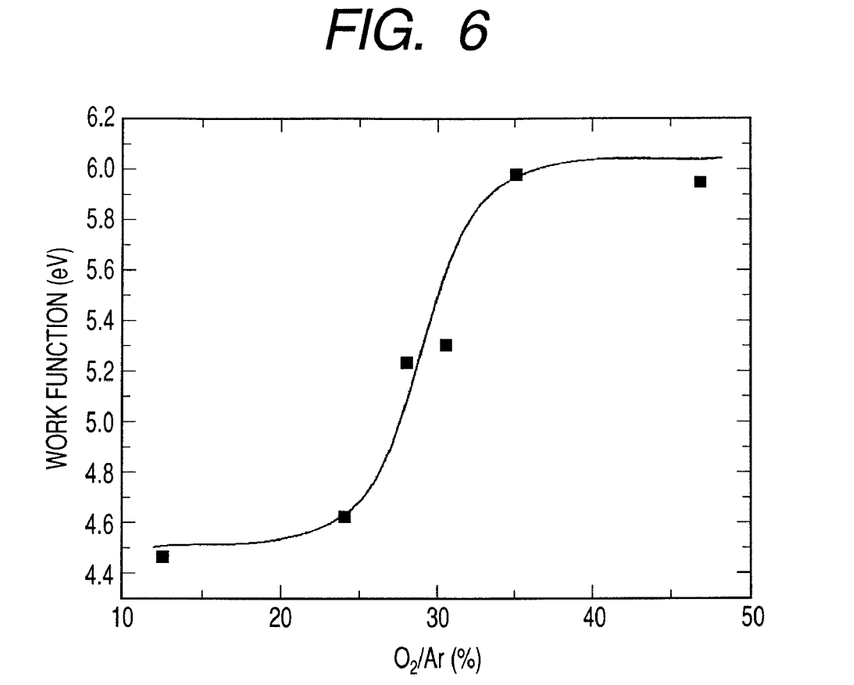
FIG. 6 is a graphical representation illustrating the dependence of a work function of an $MoO_x$ thin film on an oxygen partial pressure.

FIG. 6 is a graphical representation illustrating the dependence of the work function of the $MoO_x$ thin film on the oxygen partial pressure. Here, when the oxygen partial pressure is 25% or less, the $MoO_x$ thin film has such a remarkably high conductivity as about $1.0 \times 10^5$ S/cm at room temperature. In addition, it can be seen from FIG. 6 that a thin film formed when the oxygen partial pressure is 25% or less has a work function comparable to that of Mo metal (4.2 eV to 4.4 eV). In view of the foregoing, it is considered that when the oxygen partial pressure is 25% or less, the $MoO_x$ thin film is an Mo metal film (x=0).

On the other hand, when the oxygen partial pressure is 25% to 35%, the formed $MoO_x$ thin film has a conductivity of $1.0 \times 10^{-6}$ S/cm to $1.0 \times 10^7$ S/cm at room temperature. In addition, it can be seen from FIG. 6 that the work function of a thin film formed when the oxygen partial pressure is 25% to 35% increases abruptly from 4.7 eV to 6.0 eV as the oxygen partial pressure increases. Accordingly, it is considered that when the oxygen partial pressure is 25% to 35%, a composition such as $MoO_2$ (x=2) containing Mo with an oxidation number of 4 or $Mo_2O_3$ (x=1.5) containing Mo with an oxidation number of 3 is present in the $MoO_x$ thin film, and that such composition contributes to the conductivity of the $MoO_x$ thin film.

Further, when the oxygen partial pressure is more than 35%, the $MoO_x$ thin film has insulating property, and its work function takes a constant value. In view of the foregoing, it is considered that when the oxygen partial pressure is more than 35%, the dominant composition in the $MoO_x$ thin film is $MoO_3$ (x=3) which contains Mo with an oxidation number of 6 and is insulative.

In addition, in this example, ITO has a work function of about 4.8 eV, and an oligofluorene compound has an ionization potential of about 6.0 eV. Accordingly, the inorganic compound layer 3 is formed while adjusting the oxygen concentration to a low value at an early stage of the formation such that the surface being in contact with ITO is made of Mo metal. Thereby, the contact resistance between the anode 2 and the inorganic compound layer 3 can be reduced. On the other hand, the oxygen partial pressure is increased continuously in association with the further formation of the thin film. Thereby, the work function of the layer 3 changes continuously in the film thickness direction of the layer 3, and the work function of the layer 3 on the organic emission layer 4 side is about 6.0 eV. Thereby, the energy barrier between the inorganic compound layer 3 and the organic emission layer 4 can be reduced. Therefore, the energy barrier at an interface between ITO and the $MoO_x$ film, and the energy barrier at an interface between the $MoO_x$ film and the organic emission layer each become small, so that holes are injected into the organic emission layer more efficiently. In addition, by forming the $MoO_x$ thin film while continuously increasing the oxygen partial pressure, the thickness of a region corresponding to an insulating portion can be reduced whereby the resistance of the entire $MoO_x$ thin film can be reduced.

Example 1

An organic electroluminescent device having a device structure illustrated in FIG. 1 was produced.

In the production of the organic electroluminescent device, the following compounds and the like were used as constituent members.

Substrate 1: glass substrate
Anode 2: indium tin oxide (ITO)
Inorganic compound layer 3: $MoO_x$ (the oxygen content (x value) being changed continuously)
Organic emission layer 4: oligofluorene compound (host) shown below and $Ir(C_8\text{-piq})_3$ (guest) shown below Oligofluorene compound (host)

Ir ($C_8$-piq)$_3$ (guest)

Electron injection layer 5: $Cs_2CO_3$
Cathode 6: Al

Next, a specific production process for the organic electroluminescent device will be described. First, ITO was formed into a film on the glass substrate (substrate 1) by sputtering, whereby the anode 2 was formed. At this time, the anode had a film thickness of 100 nm.

Next, an $MoO_x$ thin film was formed by DC sputtering by use of Mo metal as a target, whereby the inorganic compound layer 3 was formed. First, for the formation of the $MoO_x$ thin film, an Ar gas atmosphere having a pressure of 0.2 Pa to 0.3 Pa was established in a film forming apparatus. Subsequently, addition of $O_2$ to the gas atmosphere was initiated while the pressure of the gas was kept at 0.2 Pa to 0.3 Pa. The addition of $O_2$ was performed such that the partial pressure of $O_2$ increased at a rate of 5%/min and continued until the partial pressure of $O_2$ reached 50% of the total pressure of the mixed gas. In addition, at the time of the film formation, the DC sputtering was performed at a power of 20 W. The inorganic compound layer 3 made of $MoO_x$ was formed by the above method. At this time, the inorganic compound layer 3 had a film thickness of about 30 nm.

Next, a coating liquid was prepared by dissolving the oligofluorene compound as the host and $Ir(C_8\text{-piq})_3$ as the guest in 1,2-dichloropropane as a solvent. At this time, the mixing weight ratio of the host and the guest was 99:1, and the mixing weight ratio of the solutes (the host and the guest) and the solvent was 1:99. Subsequently, the thus prepared coating liquid was applied onto the above inorganic compound layer 3 by spin coating at 1,000 rpm, whereby the organic emission layer 4 was formed. At this time, the organic emission layer 4 had a film thickness of about 80 nm.

Next, $Cs_2CO_3$ was formed into a film by resistive heating evaporation, whereby the electron injection layer 5 was formed. At this time, the electron injection layer 5 had a film thickness of 2.4 nm. Next, Al was formed into a film by resistive heating evaporation, whereby the cathode 6 was formed. At this time, the cathode had a film thickness of 80 nm. Finally, in a nitrogen atmosphere, the resultant was covered with a protective glass plate, and was encapsulated with an acrylic resin-based adhesive. As described above, the organic electroluminescent device was obtained.

When a DC voltage of 10 V was applied to the resultant device with the ITO electrode being connected to a positive electrode of a power source and the Al electrode being connected to a negative electrode of the power source, a current flowed in the device. At this time, the current density was 100 mA/cm$^2$, and the device was observed to emit red light at a luminance of 12 cd/m$^2$.

Example 2

A device was produced by following the same procedure as in Example 1 with the exception that an electron-blocking layer was further provided between the organic emission layer and the inorganic compound layer by a below-mentioned method.

In this example, polyvinyl carbazole (PVK) was employed as a constituent material for the electron-blocking layer. In this example, the electron-blocking layer was formed by applying a 1.0-wt % solution of PVK in chlorobenzene by spin coating at 1,000 rpm. At this time, the electron-blocking layer had a film thickness of about 30 nm.

The resultant device was evaluated in the same manner as in Example 1. As a result, when a DC voltage of 10 V was applied to the device, a current flowed in the device. At this time, the current density was 32 mA/cm$^2$, and the device was observed to emit red light at a luminance of 400 cd/m$^2$.

Comparing this example with Example 1, the additional provision of the electron-blocking layer (PVK layer) was observed to increase the resistance of the device, but the device of this example was superior in emission efficiency to the device of Example 1. In addition, PVK has a lowest unoccupied molecular orbital (LUMO) level of about 2 eV, which is lower than that of the oligofluorene compound, i.e., about 3 eV. Accordingly, the PVK layer was found to serve as an electron-blocking layer and to lead to an improvement in efficiency of the device.

Comparative Example 1

A device was produced by following the same procedure as in Example 2 with the exception that the inorganic compound layer 3 was not provided. The resultant device was subjected to measurement and evaluation in the same manner as in Example 2. Table 1 shows the results.

Comparative Example 2

A device was produced by following the same procedure as in Example 2 with the exception that the partial pressure of O$_2$ at the time of the formation of the inorganic compound layer 3 by sputtering was constantly set to 50%. The resultant device was subjected to measurement and evaluation in the same manner as in Example 2. Table 1 shows the results.

TABLE 1

|  | Maximum external quantum efficiency (%) | Voltage (V) @ 50 cd/m$^2$ |
| --- | --- | --- |
| Example 1 | 0.3 | 18 |
| Example 2 | 3.8 | 5.2 |
| Comparative Example 1 | 1.4 | 9.0 |
| Comparative Example 2 | 2.5 | 7.4 |

It can be seen from Table 1 that the organic electroluminescent device produced in Example 2 has higher efficiency than those of the devices of Comparative Examples 1 and 2, and can be driven at a lower voltage than the drive voltages of the devices of Comparative Examples 1 and 2. Since the interface portion of MoO$_x$, which was used as a constituent member for the inorganic compound layer 3 in Example 2, being in contact with ITO is Mo metal, the contact resistance between the anode 2 and the inorganic compound layer 3 is considered to be extremely small. Meanwhile, the work function of MoO$_x$ on the electron-blocking layer or organic emission layer side is about 6.0 eV, which is close to the HOMO level of PVK or the constituent material of the organic emission layer 4. Accordingly, it is considered that the energy barrier at the interface between the inorganic compound layer 3 and the electron-blocking layer 11 or the organic emission layer 4 is small. In addition, as illustrated in FIG. 6, the composition of MoO$_x$ changes continuously by virtue of the adjustment of the O$_2$ concentration, so that the potential of a hole can be smoothly shifted from the value of the work function on the anode side to the value of the work function on the organic emission layer side. It is considered that for the reason described above, holes were injected from ITO into the organic emission layer more efficiently, whereby the efficiency was improved. In view of the foregoing, it can be seen from Example 2 that by continuously changing the composition of the inorganic compound layer and by reducing a difference in work function between the inorganic compound layer and an adjacent layer, an organic electroluminescent device having high efficiency and a long lifetime can be provided.

The foregoing shows that the organic electroluminescent device of the present invention has high efficiency and a long lifetime. Therefore, the organic electroluminescent device of the present invention can be utilized as a constituent device for a display panel or display apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-227725, filed Sep. 3, 2007, which is hereby incorporated by reference herein in its entirety.

What is claimed is:

1. An organic electroluminescent device comprising, in sequence:
    (a) an anode;
    (b) an inorganic compound layer comprised of molybdenum oxide;
    (c) an organic emission layer; and
    (d) a cathode,
    wherein the ratio of oxygen atoms in the molybdenum oxide increases from the anode side to the organic emission layer side in the layer thickness direction,
    wherein the inorganic compound layer has a hole-transporting ability, and
    wherein a work function of the inorganic compound layer changes continuously in a film thickness direction of the inorganic compound layer.

2. The organic electroluminescent device according to claim 1, further comprising an electron-blocking layer provided between the inorganic compound layer and the organic emission layer.

3. A method of producing the organic electroluminescent device set forth in claim 1, which comprises forming the organic emission layer by a coating process.

4. A display apparatus comprising the organic electroluminescent device set forth in claim 1.

5. The organic electroluminescent device according to claim 2, wherein the election-blocking layer comprises a polymeric material.

6. The organic electroluminescent layer according to claim 1, wherein the organic emission layer comprises an oligofluorene compound.

* * * * *